Dec. 30, 1969 G. B. BUNN 3,487,269

SLOTTED CORDWOOD MODULE

Filed Dec. 4, 1967

INVENTOR.
GEORGE B. BUNN

BY R. H. Quist

ATTORNEY.

3,487,269

SLOTTED CORDWOOD MODULE

George B. Bunn, South Daytona, Fla., assignor to General Electric Company, a corporation of New York Filed Dec. 4, 1967, Ser. No. 687,861
Int. Cl. H02b *1/04, 9/00;* H05k *1/00*
U.S. Cl. 317—101 2 Claims

ABSTRACT OF THE DISCLOSURE

A cordwood module having spaced printed circuit boards with integrated circuit packages between them. The packages have a plurality of aligned leads at opposite edges and assembly is made by forming slots in from the edge of the boards permitting the packages to be slid into position.

BACKGROUND OF THE INVENTION

The invention relates generally to modular circuit configurations and more particularly to cordwood modules incorporating integrated circuits in packages with aligned leads.

One well known method of combining discrete circuit components into a circuit module is the cordwood approach. The components are positioned between a pair of printed circuit boards with their leads passing through holes in the boards to be joined to the printed circuitry. More recently, microelectronic integrated circuits have become available which include many circuit elements in packages with dimensions in tenths of an inch. These packages have a plurality of aligned leads extending from opposite ends to permit various connections to be made to the circuits contained therein. Currently such packages are available with from 10 to 40 leads and are given such designations as flat packs, etc. Customarily these packages are assembled in cordwood configuration by first inserting one set of the leads of each packing through the holes in the lower circuit board, and then lowering the upper board over the other set of leads. The large number and small cross-section of the leads makes it difficult to insert them through the holes in the upper boards.

SUMMARY

It is an object of this invention to facilitate the fabrication of cordwood type module incorporating packages with in line leads.

In a preferred form of the invention, the printed circuit boards to which the leads of the packages are to be connected are provided with slots leading in from the edge. The packages can then be slid laterally between the circuit boards with the entire group of leads from both sides protruding from the slots in the boards. The leads are then bent over and secured to the printed circuits by soldering or the like.

DESCRIPTION OF THE PREFERRED EMBODIMENT

Figure 1:
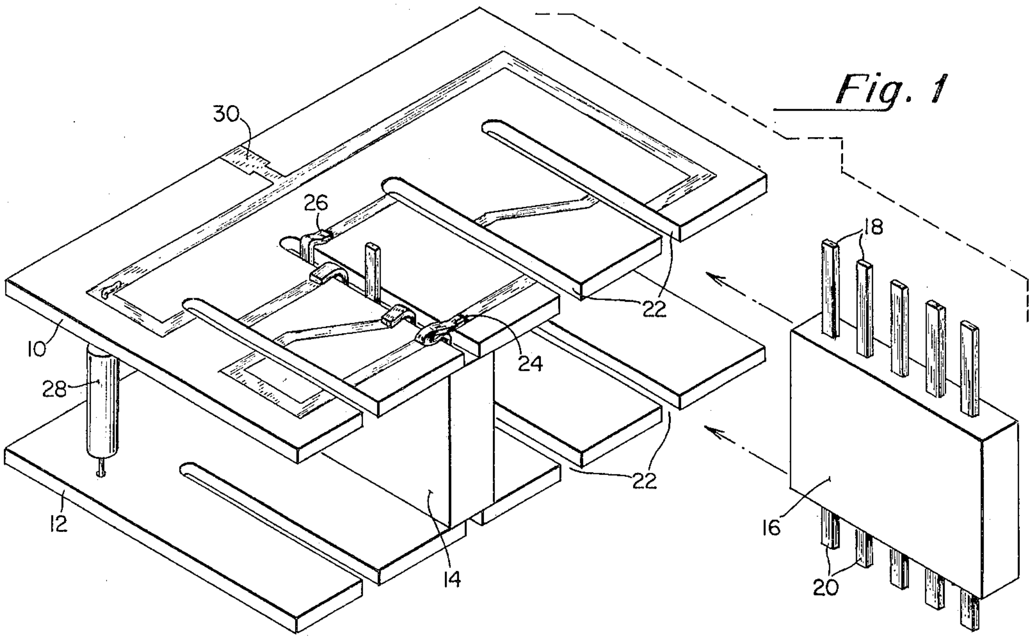
FIGURE 1 is a schematic isometric of one embodiment of a partially fabricated cordwood module in accordance with the invention.

Referring to FIGURE 1, board 10 having a circuit printed on its upper surface, and board 12 with a circuit printed on its lower surface (not shown), have mounted between them an integrated circuit package 14. Package 14 has five leads extending from its upper edge and five more from the opposite edge in the same manner as package 16 with upper leads 18 and lower leads 20. Other package configurations can be mounted in the same way as the flat packs illustrated, and packages with more or less than five leads can similarly be employed.

Contrary to the usual method of drilling separate holes for each lead in the boards, slots 22 have been formed in boards 10 and 12. Package 16 can consequently be moved laterally into position between the boards with leads 18 and 20 extending through slots 22 in boards 10 and 12 respectively. The separate leads can then be connected to the printed circuitry by soldering or the like in the manner of lead 24 (to continue the circuit across slot 22), or in the manner of lead 26 (where a connection on only one side of the slot is necessary). It should be noted that some leads from the packages may not be used at all in which case they are normally clipped off.

Although, circuit packages having a plurality of in line leads are most conveniently mounted in the cordwood module when slots in both the upper and lower boards are utilized, many of the advantages of this invention would accrue if the packages were first mounted on a conventional board with holes for the separate leads, and the slotted board used at the opposite end. Moreover, the modules may also incorporate discrete components such as resistor 28.

Connections to the module may be made by providing terminals such as terminal 30, or by the use of pins or other well known techniques.

Figure 2:
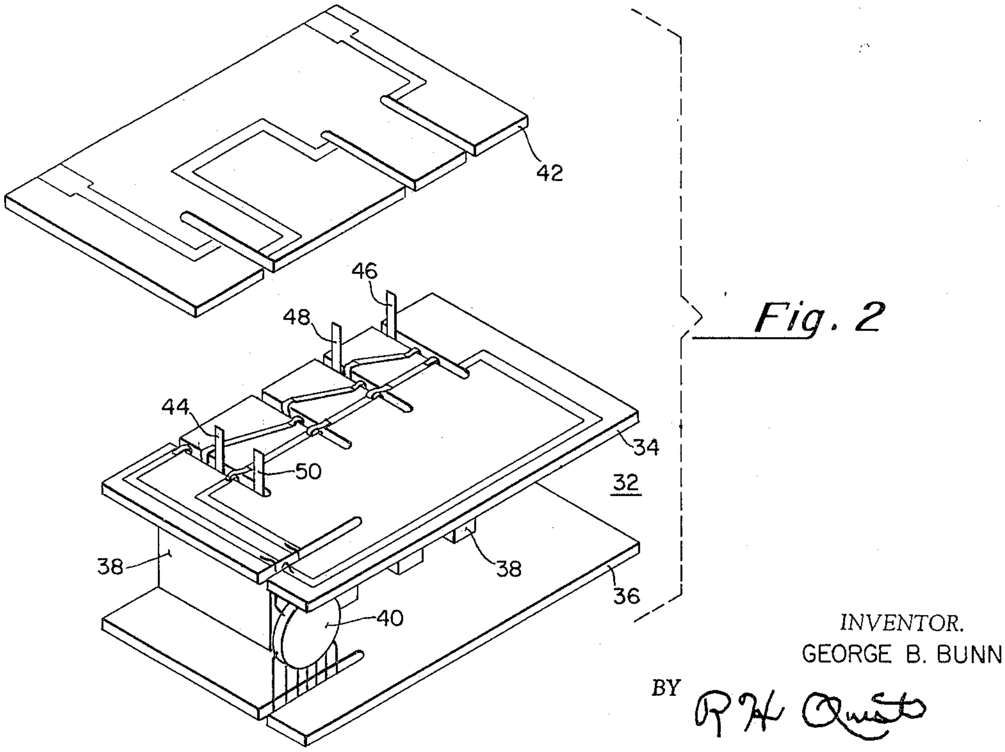
FIGURE 2 is a schematic isometric of another embodiment of the invention.

It may be noted that the use of slots decreases the board surface area which can practically be used for printed circuits. In accordance with this invention, in addition to the obvious expedients of making the boards larger or putting jumpers across the slot, the approach used in FIGURE 2 has been found useful.

Module 32, comprising printed circuit boards 34 and 36, flat packs 38, and circular integrated circuit 40, is provided with third printed circuit board 42. After the necessary connection to board 34 have been made, board 42 is slipped into position on top of board 34, and connections made between leads such as leads 44 and 46 and the printed circuitry on board 42. As shown, the edge of board 42 opposite its slots may be designed to extend beyond the edge of board 34 to facilitate connections to other modules or circuits. Any other edge of the board might also be extended. Moreover, connections can be made between leads of the module such as leads 48 and 50 by the circuitry on board 42. Board 34 could also have slots directed in the same direction as boards 34 and 36.

The use of slotted boards as described eliminates the need for the precision in lead center-to-center dimensions which is required where separate holes are drilled, facilitates the assembly operation, and even permits the removal of a defective integrated circuit package without disassembling the entire module. Of course, the usual potting techniques may be used on the completed module.

While particular embodiments of slotted cordwood modules and the method of making the same have been shown and described, it will be obvious that changes and modifications can be made without departing from the spirit of the invention.

What is claimed is:

1. A slotted cordwood module comprising:
   - a pair of spaced printed circuit boards;
   - a plurality of slots extending inwardly from one edge of said boards with the slots on one board aligned with the slots on the other;
   - a plurality of integrated circuit packages each having a plurality of aligned leads extending from opposite edges thereof positioned between said boards with each set of leads from one edge of each package extending through a slot on one of said boards, and each set of leads from the opposite edge of each package extending through the corresponding slot on the other of said boards, said leads being secured to the printed circuitry on said boards;

a third printed circuit board having slots aligned with the slots on said pair of printed circuit boards;

said third board positioned parallel to said pair of boards and mounted on top of one of said pair of boards;

said third board having an edge extending beyond the edge of said one of said pair of boards; and means connecting the printed circuitry on said third board to the circuitry of said one of said pair of boards.

2. A slotted cordwood module in accordance with claim 1 wherein:

the edge of said third board extending beyond said one of said pair of boards has terminal means thereon.

References Cited

UNITED STATES PATENTS

| | | |
|---|---|---|
| 2,958,013 | 10/1960 | Ansley. |
| 3,287,606 | 11/1966 | Schwartz. |

ROBERT K. SCHAEFER, Primary Examiner

J. R. SCOTT, Assistant Examiner

U.S. Cl. X.R.

174—68.5